United States Patent [19]
Miyasaka et al.

[11] Patent Number: 5,834,827
[45] Date of Patent: Nov. 10, 1998

[54] THIN FILM SEMICONDUCTOR DEVICE, FABRICATION METHOD THEREOF, ELECTRONIC DEVICE AND ITS FABRICATION METHOD

[75] Inventors: Mitsutoshi Miyasaka; Kiyofumi Kitawada; Minoru Matsuo; Seiichiro Higashi; Tokuroh Ozawa; Satoshi Takenaka; Yojiro Matsueda; Takashi Nakazawa; Hiroyuki Ohshima; Satoshi Inoue, all of Nagano-ken, Japan

[73] Assignee: Seiko Epson Corporation, Tokyo, Japan

[21] Appl. No.: 748,835

[22] Filed: Nov. 14, 1996

Related U.S. Application Data

[63] Continuation-in-part of Ser. No. 591,681, filed as PCT/JP95/01196 Jun. 15, 1995.

[30] Foreign Application Priority Data

| Jun. 15, 1994 | [JP] | Japan | 6-133374 |
| Mar. 29, 1995 | [JP] | Japan | 7-72144 |
| Jan. 29, 1996 | [JP] | Japan | 8-013342 |

[51] Int. Cl.$^6$ .................................................. H01L 23/54
[52] U.S. Cl. .......................... 257/578; 257/407; 257/412; 257/763
[58] Field of Search .................................. 257/578, 773, 257/774, 763

[56] References Cited

U.S. PATENT DOCUMENTS

| 4,624,737 | 11/1986 | Shimbo . |
| 5,060,029 | 10/1991 | Nishizawa et al. . |
| 5,177,589 | 1/1993 | Kobayashi et al. . |
| 5,188,970 | 2/1993 | York et al. . |

FOREIGN PATENT DOCUMENTS

| A-58-164267 | 9/1983 | Japan . |
| 60-173867 | 2/1984 | Japan . |
| A-59-204275 | 11/1984 | Japan . |
| A-63-115328 | 5/1988 | Japan . |
| A-2-73330 | 3/1990 | Japan . |
| A-2-137797 | 5/1990 | Japan . |
| A-3-48826 | 3/1991 | Japan . |
| A-3-52264 | 3/1991 | Japan . |
| A-3-293329 | 12/1991 | Japan . |
| A-4-7843 | 1/1992 | Japan . |
| A-4-63263 | 2/1992 | Japan . |
| A-4-245482 | 9/1992 | Japan . |
| A-5-55582 | 3/1993 | Japan . |
| A-6-97079 | 4/1994 | Japan . |
| A-6-132306 | 5/1994 | Japan . |
| A-6-163401 | 6/1994 | Japan . |
| A-6-232059 | 8/1994 | Japan . |
| A-6-275524 | 9/1994 | Japan . |

OTHER PUBLICATIONS

Ohshima, H., et al. "Full–Color LCDs with Completely Integrated Drivers Utilizing Low–Temperature Poly–Sl TFTs," *SID 93 Digest*. 1993, pp. 387–390.

S. Inoue et al., "425° C. Poly–Si TFT Technology and Its Applications to Large Size LCDs and Integrated Digital Data Drivers," *Asia Display* 1995, pp. 339–342.

*Primary Examiner*—Stephen Meier
*Attorney, Agent, or Firm*—Oliff & Berridge, PLC

[57] ABSTRACT

Electronic devices are provided with electrically conductive interconnections which are formed on the insulator material. Such electronic devices include, for example, thin film semiconductor devices (TFT), metal-insulator-metallic type non-wiring elements (MIM), solar cells, Large Scale Integration devices (LSI) or printed-wiring boards. At least a part of the electrically conductive interconnections are made of α-structure tantalum (Ta) which contains hydrogen. The α-structure tantalum does not have cubical crystals in its crystal system, but rather has body-centered cubes (bcc). The resistivity of the α-structure tantalum is from about 20 $\mu\Omega$ centimeters to about 60 $\mu\Omega$ centimeters. When hydrogen is included within this α-structure tantalum film, small amounts of nitrogen may be contained along with the hydrogen in the film. When a semiconductor layer is directly formed on the lower conductive layer, the upper conductive layer contains, as a primary component, the hydrogen contained α-structure tantalum.

6 Claims, 1 Drawing Sheet

THIN FILM SEMICONDUCTOR DEVICE, FABRICATION METHOD THEREOF, ELECTRONIC DEVICE AND ITS FABRICATION METHOD

This is a Continuation-In-Part of application Ser. No. 08/591,681 Filed on Feb. 15, 1996.

1. FIELD OF THE INVENTION

This invention relates to a thin film semiconductor device applied to, for example, an active matrix liquid crystal display, and its fabrication method. This invention also relates to an electronic device with electrical interconnects formed on the insulator material, and its fabrication method.

2. BACKGROUND TECHNOLOGY

In recent years, along with increases in screen size and improvements in resolution, the driving methods for liquid crystal displays (LCDs) are moving from simple matrix methods to active matrix methods; and the displays are becoming capable of displaying large amounts of information. LCDs with more than several hundreds of thousands pixels are possible with active matrix methods which place a switching transistor at each pixel. Transparent insulating substrates such as fused quartz and glass which allow the fabrication of transparent displays are used as substrates for all types of LCDs. Although ordinarily semiconductor layers such as amorphous silicon or polycrystalline silicon are used as the active layer in thin film transistors (TFTs), the use of polycrystalline silicon which has higher operating speeds is advantageous for the case of producing monolithic displays which include integrated driving circuits. When polycrystalline silicon is used as the active layer, fused quartz is used as the substrate; and a so-called "high temperature" process in which the maximum processing temperature exceeds 1000° C. is used to fabricate the TFTs. On the other hand, for the case of an amorphous silicon active layer, a common glass substrate can be used. For increases in LCD display size while maintaining low costs, such use of low-cost common glass substrates is indispensable. Such amorphous silicon layers, however, have such problems as electrical characteristics far inferior to those of polysilicon layers and slow operating speed. Since the high temperature process polysilicon TFTs use quartz substrates, however, there are problems with increasing display size and decreasing costs. Consequently, there is a strong need for technology which can fabricate a thin film semiconductor device employing a semiconductor layer such as polycrystalline silicon as the active layer upon a common glass substrate. But, when using large substrates which are well-suited to mass production, there is a severe restriction in that the substrates must be kept below a maximum processing temperature of about 570° C. in order to avoid deformation of the substrates. In other words, technology which can produce, under such restrictions, the active layer of thin film transistors capable of controlling a liquid crystal display and of thin film transistors which can operate driving circuits at high speed is desired. These devices are currently known as the present low temperature poly-Si TFTs.

Previous low temperature poly-Si TFTs are shown on p. 387 of the SID (*Society for Information Display*) '93 *Digest* (1993). According to this description, 50 nm of amorphous silicon (a-Si) is first deposited at 550° C. by LPCVD using monosilane ($SiH_4$) as the source gas and then converted from a-Si to poly-Si by laser irradiation. After patterning of the poly-Si layer, a gate insulator layer of $SiO_2$ is deposited by ECR-PECVD at a substrate temperature of 100° C. Following formation of the tantalum (Ta) gate electrode on top of the gate insulator layer, self-aligned transistor source and drain regions are formed in the silicon layer by ion implantation of donor or acceptor impurities while using the gate electrode as a mask. This ion implantation, known as "ion doping", is accomplished by a non-mass separating ion implanter. Hydrogen-diluted phosphine ($PH_3$), diborane ($B_2H_6$) or similar gas is used as a source gas for ion doping. Activation of the impurities is carried out at 300° C. Following deposition of an interlevel insulator layer, electrodes and interconnects such as indium tin oxide (ITO) and aluminum (Al) are deposited to complete the thin film semiconductor device.

As described below, however, there are several inherent problems with poly-Si TFTs fabricated by the existing technology in the low temperature process which act as impediments to the adoption of this technology into mass production.

1. The resistance of the conductive material used in the gate electrode and scan interconnect is high. This causes dullness in the waveform of scanning signal, and prevents normal operation of the switching TFT formed for each of the pixels. Thus, the liquid crystal display (LCD) can not be made highly precise or enlarged.

2. When a self aligned TFT (S/A TFT) is formed using ion implantation by forming source and drain regions in a self aligning manner, relative to the gate electrode, the gate electrode must have an ability to prevent the injected ions from going into the semiconductor film, which functions as a channel region, and the gate insulating film, which is formed directly on the semiconductor film. However, if the gate electrode is made of metal, the injected ions pass through the metallic crystal lattice with some probability. This means that the ion blocking ability of the gate electrode is inferior, and S/A TFT can not be stably produced.

3. In electronic devices with long interconnections, which are typically used in large-sized LCDs, the interconnects break easily because of internal stress of the interconnect material and thermal expansion/contraction due to changes in temperature. This situation becomes more serious when the interconnection such as a scan line of S/A TFT crosses over steps (i.e., a step of semiconductor island in S/A TFT, for example). For this reason, manufacturing yield of the electronic device strikingly deteriorates.

Therefore, the present invention aims to overcome these problems and to provide a method for stably fabricating superior thin film semiconductor devices and electronic devices with simple and practical means.

DESCRIPTION OF THE INVENTION

The basic principles and operation of the present invention will be described with reference to attached drawings.

I. Electronic Device And Its Fabricating Method According To The Present Invention An electronic device of the invention has electrically conductive interconnections which are formed on an insulator material. Examples of such electronic devices include thin film semiconductor devices (TFT), metal-insulator-metallic type non-linear devices (MIM), solar cells, Large Scale Integration (LSI) semiconductor devices or printed wiring boards. At least a portion of the electrically conductive interconnection uses α-structure tantalum (Ta) containing hydrogen. The α-structure tantalum forms a cubical crystal system, and the crystalline structure is a body-centered cube (bcc). The specific resistance of the α-structure tantalum extends from about 20 $\mu\Omega$cm to about 60 $\mu\Omega$cm. Such α-structure tantalum includes one in which hydrogen is contained within an α-structure tantalum film as a simple substance, and one in which small amounts of nitrogen is also contained with the hydrogen in the film. Alternatively, there is an embodiment in which the conductive layer is composed of lower conductive film and upper conductive film formed directly on the lower conductive film, and the upper conductive film includes α-structure tantalum containing hydrogen as a primary component. In any cases, the primary component is tantalum. When the upper conductive film containing α-structure tantalum as its primary component is formed directly on the lower conductive layer, the lower conductive layer is made from thin niobium (Nb), tungsten (W), or tantalum nitride (TaN), with a thickness of from approximately 20 nm to about 200 nm. The purpose of using these materials is to make the tantalum contained in the upper conductive film α-structure tantalum.

Generally, the conventional α-structure tantalum (particularly α-structure tantalum which contains nitrogen) has a very strong internal stress when it is formed by a Physical Vapor Deposition (PVD) method, such as spattering. However, the α-structure tantalum according to the present invention contains minute quantities of hydrogen, and therefore, the internal stress is greatly mitigated.

The amount of hydrogen contained in the tantalum thin film is from about 10 atm ppm (1 atm ppm represents 1 hydrogen atom relative to $10^6$ tantalum atoms) to about 5000 atm ppm. If the amount of hydrogen contained in the tantalum film is far greater than approximately 5000 atm ppm, then the tantalum becomes brittle and separates from the substrate covered with insulation material, or breaks occur in the interconnections. However if it is less than approximately 5000 atm ppm, the internal stress will be sufficiently small, and the α-structure tantalum will have good ductility. Even if it is used in a system in which the thermal expansion coefficient of the tantalum is notably different from that of the substrate, the tantalum thin film can maintain sufficient durability against stress and thermal expansion/contraction which are caused by the large difference of the thermal expansion coefficients.

Conversely, if the amount of contained hydrogen is less than approximately 10 atm ppm, the effect of the inclusion of hydrogen will not be apparent, and strong internal stress will occur, similar to the conventional α-structure tantalum. Hence, the hydrogen contained α-structure tantalum, used in an electronic device according to the present invention, has a low resistivity from approximately 1/10 to 1/4 the resistivity of the conventional β-structured tantalum. The internal stress is also adequately mitigated, and the film can be ductile. These advantages will become more apparent when the substrate, on which a tantalum thin film is formed, is made of materials such as glass or plastic which have a thermal expansion coefficient greatly different from that of metal, or when the substrate is made of such materials that deform or distort easily.

The hydrogen contained α-structure tantalum according to the present invention can be formed with the following methods. In the first fabrication method, a thin film containing tantalum as a primary component is formed by spattering deposition in an atmosphere which contains at least hydrogen, nitrogen and argon.

With the ordinary spattering method, argon plasma is formed in the film formation chamber and the thin film is deposited using the argon plasma. Whereas, according to the present invention, although the atmosphere contains argon gas as the primary component, small amounts of nitrogen and hydrogen are added to the atmosphere to form a plasma mixture of argon, nitrogen and hydrogen. This plasma mixture is used in the spattering deposition process to form the thin film which contains tantalum as the primary component. Preferably, the nitrogen content in the argon is approximately from about 5.0% to about 8.5%. Within this range, the resultant α-structure tantalum thin film has relatively small resistivity and relatively weak internal stress. This is because a minute α-structure tantalum nitride (TaN) region is produced within the spattered tantalum thin film, and this TaN region functions as seeds to make the tantalum the primary component of the α-structure region. The tantalum nitride itself has an α-structure, however, its resistivity is large and its internal stress is strong. Therefore, if the nitrogen content in the argon gas is too high, the proportion of the tantalum nitride within the tantalum thin film increases, which results in large resistivity and strong internal stress of the deposited thin film. Conversely, if the nitrogen content is too low, then the tantalum thin film can not be α-structure but is β-structured. In this state, the resistivity is as high as approximately 200 $\mu\Omega$cm and the internal stress of the deposited thin film is increased by some amounts which is due to the nitrogen addition.

The hydrogen content within the argon gas should be adjusted so that hydrogen in the resultant tantalum film is from about 10 atm ppm to about 5000 atm ppm corresponding to the deposition rate of the tantalum thin film, being from approximately 0.1% to approximately 10%. As a conclusion, if the tantalum thin film is deposited in the argon atmosphere containing 5.0% to about 8.5% nitrogen, then α-structure film having a relatively small internal stress and low resistivity can be obtained. Furthermore, if hydrogen is added to the film in the amounts of from approximately 10 atm ppm to approximately 5000 atm ppm, the internal stress is further reduced, while the ductility of the film is increased.

The second fabrication method is applied to a situation where the electronic device includes a conductive layer composed of a lower conductive layer and an upper conductive layer formed directly on the lower conductive layer and containing α-structure tantalum as the primary component. First, the lower conductive layer is formed. The lower conductive layer is made of material that can make the tantalum in the upper conductive layer α-structure tantalum. This lower conductive layer is deposited by PVD methods, such as ordinary spattering, vacuum evaporation, or Chemical Vapor Deposition (CVD) methods. Since the tantalum of the upper conductive layer is formed by spattering in the next step, if the lower layer is also formed by the same spattering method, the first and second film forming steps can be continuously executed without releasing a vacuum. This can result not only in improvements in productivity, but the upper tantalum thin film is reliably α-structure because the crystal structure of the lower conductive layer can be easily taken over by the upper conductive layer.

In the second step, a thin film containing α-structure tantalum as the primary component is formed by spattering in the atmosphere that contains at least hydrogen and argon. The hydrogen content in the argon is adjusted so that the resultant α-structure tantalum film contains from approximately 10 atm ppm to approximately 5000 atm ppm of hydrogen, as mentioned above. Therefore, the hydrogen content percentage is from approximately 0.1% to approximately 10%.

The third fabrication method forms a thin film which contains α-structure tantalum as the primary component as a first step. Then, a hydrogenation treatment is applied to the thin film to add a desired amount of hydrogen to the thin film, in a second step. Generally, the tantalum thin film formed in the first step has internal stress. Because of this, if the thin film sustains a large temperature change, cracks or peeling of the film will occur due to the internal stress.

Therefore, it is ideal that hydrogenation of the second step be accomplished with as little change in the thermal environment as possible, such as cooling or heating. It is desirable that a process temperature from the completion of the first step to the beginning of the second step is equal to or below the substrate processing temperature in the first step. This restriction can be mitigated in view of the substrate conditions. That is, the restriction may be mitigated as long as the problems of cracks or peeling do not occur. Forming the thin film which contains the α-structure tantalum as the primary component (in the first step) is accomplished by using a spattering method in the atmosphere containing at least nitrogen and argon, as has been described above. The nitrogen content in the Argon at the time of spattering deposition should be from about 5.0% to about 8.5%.

As an alternative technique for forming the thin film which contains α-structure tantalum as the primary component in the first step, a thin tantalum film may be formed by spattering directly on the lower conductive layer. This technique corresponds to the second fabrication method, but without adding hydrogen. In other words, after the lower conductive layer is formed of materials such as niobium, tungsten, or tantalum nitride, which can make the upper tantalum layer α-structure tantalum, tantalum thin film is deposited directly on the lower conductive layer by spattering.

When the thin film, which contains tantalum as the primary component, has been formed in the first step using various techniques, hydrogen is added to ease the internal stress of the thin film in the second step, before any great temperature changes occur which would cause peeling or cracking of the thin film. This hydrogenation treatment in the second step may be accomplished by hydrogen ion implantation, hydrogen plasma treatment, or heat treatment in the hydrogen contained atmosphere. If the hydrogen plasma treatment is continuously executed after the first step, using the spattering device for depositing the tantalum thin film in the first step, then there will be no oxide film or contamination on the tantalum film surface, thereby improving the efficiency of the addition of hydrogen. In addition, it becomes possible to ease the internal stress before the thermal stress is applied to the thin film, because no extra step is interposed between the first and second steps. Of course, the productivity is simultaneously improved. If hydrogenation is carried out by hydrogen ion implantation, then the amount of hydrogen added to the thin film can be precisely regulated. In other words, the characteristics of the tantalum thin film can be freely changed.

This method is particularly useful when the hydrogen contained α-structure tantalum is applied to a gate electrode of a top gate type thin film semiconductor device (which will be described below). This is because, after α-structure tantalum film, as a gate electrode, is formed in the first step, the addition of hydrogen of the second step can be performed simultaneously with an ion implantation process for forming source and drain regions using the gate electrode as a mask. In this manner, the objective of the present invention can be achieved without adding a particular step for hydrogenation.

II. Summary Of Thin Film Semiconductor Device According To The Present Invention, And Its Fabrication Method Next, an explanation will be provided for a thin film semiconductor device, to which the present invention is effectively applied among various electronic devices described in Section I, and for its fabrication method. FIGS. 1(a) through 1(d) are schematic cross-sectional views of the thin film semiconductor device, showing the fabrication process of the thin film semiconductor device composing MIS type electric field effective transistors. As shown by the drawings, the thin film semiconductor device, which makes the best use of the invention, is a top gate type TFT. In other words, the thin film semiconductor device according to the present invention comprises a semiconductor layer which is formed like islands on the insulator material, a gate insulator layer formed on the semiconductor layer, and a gate electrode formed on the gate insulator layer. Referring to the drawings, background knowledge will be provided regarding the application of the invention to the low temperature process poly-Si TFT.

In the present invention, a conventional non-alkaline glass is used as an example for substrate 101. First, an insulating underlevel protection layer 102 is formed on top of substrate 101 by a technique such as atmospheric pressure chemical vapor deposition (APCVD), PECVD, or sputtering. Next, a semiconductor layer such as intrinsic silicon, which will later become the active layer of the semiconductor device, is deposited. The semiconductor layer can be formed by chemical vapor deposition (CVD) such as LPCVD, PECVD, or APCVD or by physical vapor deposition (PVD) such as sputtering or evaporation. Crystallization of the semiconductor layer so fabricated is achieved by short-time irradiation using electromagnetic energy or optical energy such as from laser light.

When the originally deposited semiconductor layer is amorphous or a mixture of amorphous and microcrystalline material, this process is known as crystallization. On the other hand, if the originally deposited semiconductor layer is polycrystalline, the process is known as recrystallization. In this description of the present invention, both are simply referred to as "crystallization" unless it is necessary to make a distinction.

If the intensity of the energy from laser light or other source is high, the semiconductor layer will crystallize by initially melting and then solidifying upon cooling. This is known as melt crystallization in the present invention. Conversely, crystallization in which the semiconductor layer does not melt but proceeds in the solid state is known as solid phase crystallization (SPC). Solid phase crystallization can be divided mainly into three types: furnace-SPC in which crystallization occurs at temperatures from 550° C. to 650° C. for times ranging from a few hours to several tens of hours, rapid thermal annealing (RTA) in which crystallization occurs in a very short time frame ranging from less than one second up to about one minute at temperatures of 700° to 1000° C., and very short time-SPC (VST-SPC) using low intensity energy such as from a laser.

Although all three types of crystallization are suitable for use in the present invention, melt crystallization, RTA and VST-SPC are particularly appropriate when considered in light of processing which allows high productivity for large substrates. The reason for this is not only that these crystallization methods use extremely short irradiation periods but also that the whole substrate is not heated during crystallization of the semiconductor layer since the irradiated area is localized with respect to the entire substrate area; and, therefore, no heat-induced deformation or cracking of the substrate occurs. Following crystallization, the semiconductor layer is patterned; and then the active semiconductor layer 103 is produced. See FIG. 1(a).

After formation of the semiconductor layer, the gate insulator layer 104 is formed by a method such as CVD or PVD. Several methods can be considered for the fabrication of insulating films, but a fabrication temperature of 350° C.

or less is desirable. This is essential to avoid thermal degradation of the MOS interface and the insulating film. This is applicable to subsequent steps in the fabrication process as well. Processing temperatures following fabrication of the gate insulator layer must be kept at or below 350° C. Doing so allows high performance semiconductor devices to be produced both easily and reliably.

Next, a thin film which will become the gate electrode 105 is deposited by a method such as PVD or CVD. Since the same material is usually used for both the gate electrode and the gate interconnects and both are fabricated in the same step, it is desirable to use a material which has low electrical resistance and is stable with respect to thermal processing around 350° C.

After patterning of the thin film for the gate electrode, ion incorporation 106 into the semiconductor layer is employed to form the source and drain regions 107 and the channel region 108. See FIG. 1(c). During this process, the gate electrode acts as a mask for ion implantation so that the channel is formed only underneath the gate in a self-aligned structure. For impurity ion incorporation, both ion doping, in which non-mass separation equipment is used and hydrogenated impurity species as well as hydrogen are incorporated into the film, and ion implantation, in which mass-separation ion implanters are used and only the desired impurities themselves are incorporated into the film, are applicable. Source gases for ion doping use hydrogenated species of the impurity ions such as phosphine ($PH_3$) and diborane ($B_2H_6$) which are diluted in hydrogen to concentrations of 0.1% to 10%. In the case of ion implantation, hydrogen ions (protons or molecular hydrogen ions) are implanted following the implantation of the desired impurity elements by themselves.

In order to maintain a stable MOS interface and gate insulator layer, the temperature must be kept at or below 350° C. for both ion doping and ion implantation. In order to always reliably carry out the impurity activation at a low temperature of 350° C. or less, it is desirable to keep the substrate temperature above 200° C. during implantation. On the other hand, to ensure a low temperature activation of impurity ions implanted in the channel to control the transistor threshold voltage or impurity ions implanted in lightly doped regions such as those used to form an LDD structure, it is necessary to keep the substrate temperature at or above 250° C. during ion implantation. The result is that amorphization of the ion implanted region can be avoided by performing the ion implantation at a such a high substrate temperature since recrystallization occurs simultaneously with damage to the semiconductor layer. In other words, the ion implanted region remains crystalline following implantation, and the subsequent activation of the implanted ions can still be achieved using a low activation annealing temperature of less than about 350° C.

When fabricating a CMOS TFT, the NMOS or PMOS region is alternately covered by a suitable mask material such as polyimide resin, and ion implantation is performed using the procedure above. If the substrate temperature is kept below approximately 300° C. during ion implantation, it is possible to use a cheap, easily preserved conventional photoresist as an ion implantation mask instead of the polyimide.

Next, the interlevel insulator film 109 is formed by either CVD or PVD. Following ion implantation and interlevel insulator film formation, ion activation and interlevel insulator film densification are carried out by thermal annealing in a suitable thermal environment at temperatures less than about 350° C. for a time ranging from several tens of minutes to a few hours. It is desirable for this annealing temperature to be greater than approximately 250° C. to ensure activation of the implanted ions. Additionally, for effective densification of the interlevel insulator film, a temperature of 300° C. or higher is preferred. The film quality of the gate insulator layer and the interlevel insulator layer are normally different. Accordingly, during the opening of contact holes in the two insulator films following interlevel insulator film formation, it is common for the etching rates in the two films to be different. Under such conditions, an inverse taper in which the bottom of the contact hole is wider than the top or the formation of a canopy can result. During electrode formation, these undesirable structures can be causes of poor contact between the electrode and underlying layers in the device leading to so-called "contact failure." The generation of contact failure can be minimized by effective densification of the interlevel insulator film. Following formation of the interlevel insulator layer, contact holes are opened above the source and drain regions; and source and drain electrodes 110 and interconnects are formed by PVD or CVD to complete the fabrication of the thin film semiconductor device. See FIG. 1(d).

III. Detailed Explanation On The Thin Film Semiconductor Device Of The Present Invention And Its Fabrication Method The hydrogen contained α-structure tantalum, which was explained in Section I, can be applied to various types of electronic devices. The most superior characteristics of this conductive material is low resistivity, small internal stress, and ductility. Such characteristics becomes especially advantageous when electronic devices have: long interconnections; substrate characteristics that are extremely different from those of interconnections, interconnections that go over a step which cannot be ignored relative to the thickness of the interconnections, and performance parameters that are affected by the internal stress of the interconnections. Examples of these electric devices include solar cells and thin film semiconductor devices formed on a glass substrate and used in a liquid crystal display device. The length of the interconnections of such electronic devices may extend from several centimeters to several tens of centimeters. In addition, the thermal characteristics of the substrate and the thermal characteristics of the interconnections ordinarily differ greatly. Accordingly, the thin film semiconductor devices exhibit their efficacy especially when used in solar cells or liquid crystal display devices among electronic devices in accordance with the invention.

As explained in Section II, there are three types of electrically conductive materials which are used in a thin film semiconductor device, including the gate electrode and its interconnection, source electrode and its interconnection, and drain electrode and its interconnection. The hydrogen contained α-structure tantalum is applicable to any of the three types of electrically conductive materials.

From the viewpoint of crossing over steps that cannot be ignored with respect to the thickness of the hydrogen contained α-structure tantalum interconnections, still another benefit can be offered to the source electrode and its interconnection or drain electrode and its interconnection of a bottom gate type TFT, or to the respective electrodes and interconnections of a top gate type TFT, reducing breakdowns which may occur at this step. Furthermore, if the hydrogen contained α-structure tantalum is used in the gate electrode and its interconnection of the top gate type TFT, the internal stress of the interconnection does not adversely affect the transistor characteristics, and at the same time, the fabrication process is simplified. This is explained hereafter.

The hydrogen contained α-structure tantalum described in Section I is applied to the gate electrode/interconnection of the top gate TFT explained in Section II. This means that at least a part of the gate electrode is made of the hydrogen contained α-structure tantalum. Of course, the gate electrode may be made of tantalum which contains nitrogen and hydrogen. Such a gate electrode is fabricated by the fabrication methods described in Section I. After the gate electrode is formed, ion implantation is carried out for forming the source and drain regions. If the α-structure tantalum containing hydrogen atoms or nitrogen atoms is used as the gate electrode, some of these atoms enter between the tantalum crystal lattice. Even if, during the ion implantation using the gate electrode as a mask, some of the ions go through the lattice of the tantalum crystal, the ions will collide against the hydrogen atoms or nitrogen atoms existing between the lattice, and will change their direction of movement. The scattered implanted ions are not able to slip between the lattice, and as a result, the gate electrode will have a perfect protective ability against the implanted ions.

Even if the gate electrode includes a conductive crystalline body, neither the P type nor the N type ion used for forming the source and drain will reach the gate insulation film positioned directly above the channel formation semiconductor region, enabling the stable fabrication of high performance TFT having superior reliability. As indicated earlier, after the completion of the first step, in which α-structure tantalum as its primary component such as nitrogen contained tantalum is formed, the thin film is processed into the gate electrode and interconnection, following the second step of the hydrogenation. If the second step is executed concurrently with the ion implantation process for forming the source and drain region, then the objective of the present invention can be efficiently achieved without increasing the number of steps.

For example, when forming the source and drain regions by ion doping, the concentration of the hydrogen for diluting the hydride of the implanted impurity elements, such as phosphine ($PH_3$) or Diborane ($B_2H_6$), is adjusted prior to the ion implantation; whereby α-structure tantalum which contains a desired amount of hydrogen can be automatically obtained. The concentration of the hydride of implanted impurity elements and the concentration of hydrogen can be easily regulated by using a secondary dilution medium such a helium, neon, argon, or krypton.

When the source and drain regions are formed by ion implantation using mass separation, following the injection of desired impurity elements, hydrogen ions (proton or hydrogen molecule ion) are implanted. The essential objective of hydrogen implantation is to activate the impurities, which have been implanted into the source and drain region, at a temperature of less than about 350° C. However, this can also be used for injection of hydrogen to the gate electrode. Thus, the objective of the invention can also be achieved in the ion implantation method, without increasing the number of steps.

In a field effect transistor type of thin film semiconductor device, in which the active layer semiconductor film is in the polycrystalline state, presence of internal stress within the gate electrode adversely affects the performance of the transistor. As explained in Section I, the hydrogen contained α-structure tantalum according to the invention has extremely weak internal stress. When used in the gate electrode, thin film semiconductor device having excellent characteristics can be obtained.

As has been described, the hydrogen contained α-structure used in electronic devices of the present invention has low resistivity and low internal stress, while having ductility. For this reason, the following effects are recognized.

1. Even in a large-sized electronic equipment having long interconnections, a drop of the electric potential within the interconnections is small because of the low resistivity. During the transmission of the electrical energy, energy loss is small. In addition, accurate electrical signals can be transmitted. For example, if the present invention is applied to a solar cell, there is an improvement in the energy conversion ratio. If it is used in a liquid crystal display device, then a clear and vivid image can be obtained across the entirety of a large screen.

2. Even if the substrate of an electronic device is made of glass, ceramic or plastic, with a characteristic greatly different from that of metals, breakage does not often occur. Furthermore, these electronic devices can be used throughout a broad temperature range.

3. Since the interconnection has ductility, it can easily go over different levels even if the level difference is too large to ignore relative to the thickness of the interconnecting film. When applied to the multi-layered interconnections of LSI or to printed wiring board, highly reliable interconnections can be obtained even if the interconnection portions are uneven.

4. The ion blocking ability during ion implantation is superior. When used in the gate electrode of a top gate type TFT, a high-performance and reliable thin film semiconductor device can be obtained.

5. When applied to the low temperature process poly-Si TFT of a top gate type, there is no need to add a special step to the conventional fabrication steps.

6. When applied to a low temperature process poly-Si TFT of a top gate type, electric characteristics of the transistor is superior.

BRIEF DESCRIPTION OF THE DRAWINGS

The above and further objects and advantages of the present invention will become clearer from the following description of preferred embodiments taken in conjunction with the following drawings, in which like reference numerals refer to like elements, and wherein.

A detailed description of the present invention is provided hereafter, with reference to the appended drawings.

DETAILED DESCRIPTION OF PREFERRED EMBODIMENTS

EXAMPLE 1

Figure 1A:
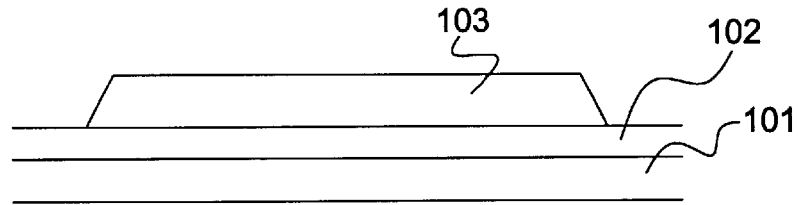
FIGS. 1(a)–1(d) are cross-sectional views of the thin film semiconductor devices in the respective fabrication steps.
Figure 1B:
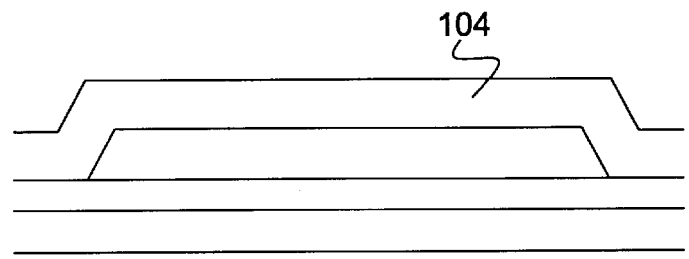
Figure 1C:
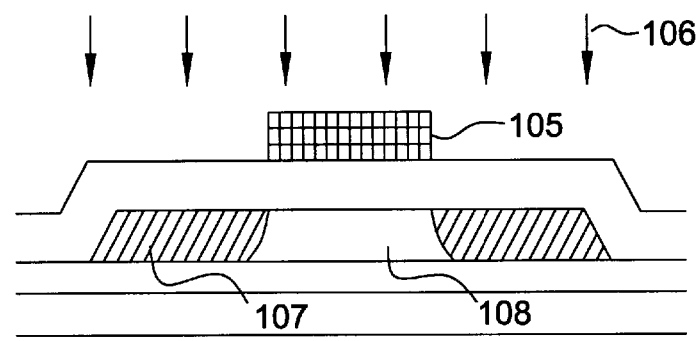
Figure 1D:
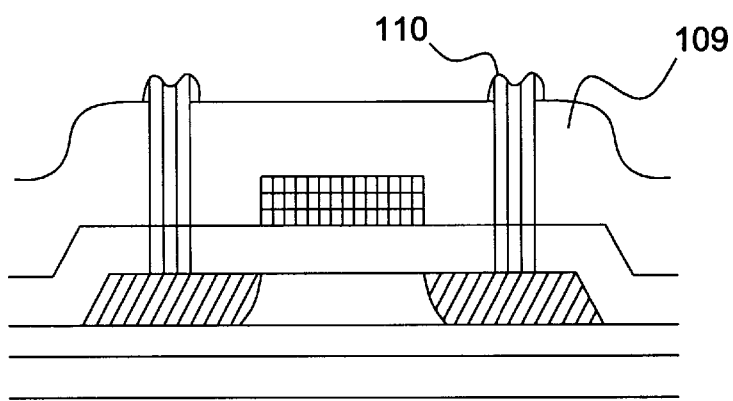

FIGS. 1(a) through (d) show cross-sectional views of the fabrication process for a thin film MIS field effect transistor.

In Example 1, a 235 mm×235 mm sheet of non-alkaline glass (OA-2, manufactured by Nippon Electric Glass Co., Ltd.) was used for substrate 101, though the type and size of the substrate are irrelevant for any substrate able to withstand the maximum processing temperature. First, silicon dioxide film ($SiO_2$ film) 102, which serves as the underlevel protection layer, is formed on substrate 101 by means of atmospheric pressure chemical vapor deposition (APCVD), PECVD, sputtering or other means. In APCVD, the $SiO_2$ layer can be deposited using monosilane ($SiH_4$) and oxygen as source gases at a substrate temperature of between about 250° C. and 450° C. In the PECVD and sputtering methods, the substrate temperature can be anywhere from room temperature to 400° C. In Example 1, a 2000 Å $SiO_2$ film was deposited at 300° C. by APCVD using $SiH_4$ and $O_2$ as source gases.

Then, an intrinsic silicon layer, which later becomes the active layer of the thin film semiconductor device, was deposited to a thickness of approximately 500 Å. The intrinsic silicon layer was deposited over 58 minutes at a temperature of 425° C. by a high vacuum LPCVD reactor having a 200 sccm flow of disilane ($Si_2H_6$) as the source gas. The high vacuum LPCVD reactor used in Example 1 has a capacity of 184.5 liters. Seventeen substrates were inserted facedown in the reaction chamber, which was maintained at 250° C. After the substrates were inserted, the turbomolecular pump was started. After the pump reached steady-state speed, a two-minute leak test was performed. The leak rate from outgassing and other sources at this time was $3.1 \times 10^{-5}$ torr/min. The 250° C. insertion temperature was then raised to a deposition temperature of 425° C. over a period of 1 hour. For the first 10 minutes after heating was initiated, no gas was introduced into the reaction chamber and heating was performed in a vacuum. The ultimate background pressure reached in the reaction chamber 10 minutes after the onset of heating was $5.2 \times 10^{-7}$ torr. During the remaining 50 minutes of the heating period, nitrogen gas having a purity of at least 99.9999% was continuously introduced at the rate of 300 sccm. The equilibrium pressure in the reaction chamber at this time was $3.0 \times 10^{-3}$ torr.

After the deposition temperature was reached, the source gases, $Si_2H_6$ and 99.9999% pure helium (He) for dilution, were introduced at the flow rates of 200 sccm and 1000 sccm, respectively; and the silicon film was deposited over a period of 58 minutes. The pressure immediately after $Si_2H_6$ and other gases were introduced into the reaction chamber was 767 mtorr; and the pressure 57 minutes after these source gases were introduced was 951 mtorr. Silicon films obtained in this way were 501 Å thick; and, except for the 7 mm periphery of the substrate, the thickness of the film varied less than ±5 Å over the 221 mm×221 mm square region.

In Example 1, the silicon layer was formed as described by means of LPCVD, but PECVD and sputtering can also be used. In the PECVD and sputtering methods, silicon film deposition temperature may be set anywhere between room temperature and approximately 350° C.

Silicon films obtained in this manner are high-purity a-Si films. Next, this a-Si layer is crystallized by irradiating it for a short period of time with either optical energy or electromagnetic energy, thereby changing it into polycrystalline silicon (poly-Si). In Example 1, the a-Si layer was irradiated using a xenon chloride (XeCl) excimer laser (wavelength of 308 nm). The laser pulse width at full-width, half maximum intensity was 45 ns. Since this irradiation time is extremely brief, the substrate is not heated when the a-Si is crystallized into poly-Si, hence substrate deformation does not occur. Laser irradiation was performed in air with the substrate at room temperature (25° C.). An 8 mm×8 mm square area is irradiated during each laser irradiation, and the irradiated area is shifted by 4 mm after each irradiation.

At first, scanning is performed in the horizontal direction (Y direction), and then the substrate is then shifted 4 mm in the vertical direction (X direction). It is then moved 4 mm more in the horizontal direction, where it is again scanned. Thereafter these scans are repeated until the entire surface of the substrate has been subjected to the first laser irradiation. The energy density of this first laser irradiation was 160 $mJ/cm^2$.

After the first laser irradiation was completed, a second laser irradiation was performed over the entire surface at an energy density of 275 $mJ/cm^2$. The scanning method used for the second irradiation is identical to that used for the first laser irradiation; scanning is performed while shifting the 8 mm×8 mm square irradiation area in 4 mm increments in the Y and X directions. This two-stage laser irradiation provides the means for uniformly crystallizing the a-Si to form poly-Si over the entire substrate.

While an XeCl excimer laser was used as the optical energy or electromagnetic energy in Example 1, other energy sources may be used provided the energy irradiation time is less than several tens of seconds. For example, irradiation may also be performed using an ArF excimer laser, XeF excimer laser, KrF excimer laser, YAG laser, carbon dioxide gas laser, Ar laser, dye laser or other laser, as well as by an arc lamp, tungsten lamp or other light source. When using an arc lamp to irradiate the a-Si layer to transform it into poly-Si, output of about 1 $kW/cm^2$ or greater and an irradiation time of about 45 seconds is used. Even at the time of this crystallization, the energy irradiation time is short, so problems such as deformation and cracking caused by heating the substrate do not occur. This silicon film was then patterned and channel region semiconductor film 103, which becomes the active layer of the transistor, was created. See FIG. 1(*a*).

Next, gate insulator layer 104 is formed by means of ECR-PECVD, PECVD, or other deposition method. In Example 1, a $SiO_2$ film was used as the gate insulator layer and was deposited to a thickness of 1200 Å using PECVD. See FIG. 1(*b*). Immediately prior to setting the substrate in the PECVD reactor, the substrate was soaked for 20 seconds in a 1.67% dilute hydrofluoric acid solution to remove the native oxide layer from the surface of the semiconductor film. There was an interval of approximately 15 minutes from the time the oxide layer was removed until the time the substrate was loaded in the loadlock chamber of the PECVD reactor. This time interval should be as short as possible in order to preserve MOS interface cleanliness; an interval of about 30 minutes, at most, is desirable.

In the PECVD method, monosilane ($SiH_4$) and nitrous oxide ($N_2O$) were used as source gases to form the gate insulator layer at a substrate temperature of 300° C. A 900 W rf plasma at 13.56 MHz was generated at a pressure of 1.5 torr. The $SiH_4$ flow rate was 250 sccm and the $N_2O$ flow rate was 7000 sccm. The $SiO_2$ deposition rate was 48.3 Å/s. Immediately before and after the $SiO_2$ layer was formed under these conditions, the silicon layer and deposited oxide layer were exposed to an oxygen plasma to improve the MOS interface and the oxide film. While monosilane and nitrous oxide were used as source gases in Example 1, an organic silane, such as TEOS ($Si\text{-}(O\text{—}CH_2\text{—}CH_3)_4$), and an oxidizing gas, such as oxygen, could also be used.

In addition, although a general-purpose PECVD reactor was used here, naturally, ECR-PECVD could also be used to form the insulator layer. Regardless of the type of CVD reactor or source gases used, it is desirable that the insulator layer formation temperature be 350° C. or less. This is important for preventing thermal degradation of the MOS interface and gate insulator layer. The same thing applies to all processes described below. All process temperatures after gate insulator layer deposition must be kept to 350° C. or less. Controlling the process temperature in this way enables high-performance thin film semiconductor devices to be fabricated easily and reliably.

Next, a thin film, which becomes gate electrode 105, is deposited by such means as sputtering, evaporation, or CVD. In Example 1, tantalum (Ta) was selected as the gate electrode material and was deposited to a thickness of 5000 Å by means of sputtering. The substrate temperature during sputtering was 180° C., and argon (Ar) containing 6.7% nitrogen ($N_2$) was used as the sputtering gas. The optimum nitrogen concentration in the argon is from 5.0% to 8.5%. The tantalum film obtained under these conditions is mostly α-Ta with a resistivity of 40 μΩcm. Therefore, the sheet resistivity of the gate electrode in Example 1 is 0.8 Ω/square.

After the film deposition, the thin film, which will be the gate electrode, is patterned by photolithography. The heat treatment prior to the exposure of the photoresist was carried out at about 90° C. and the heat treatment after the development was carried out at about 130° C. Therefore, the maximum processing temperature from the α-structure tantalum film formation to ion implantation is about 130° C. Then impurity ions 106 such as phosphorous were implanted using a bucket-type non-mass-separating ion doping apparatus (ion doping) to form source and drain regions 107 and channel region 108 in the intrinsic silicon layer. See FIG. 1(c).

In Example 1, the objective was to fabricate NMOS TFTs, so implantation was carried out to $5 \times 10^{15}$ $1/cm^2$ using hydrogen-diluted 5% phosphine ($PH_3$) source gas at a high frequency power of 38 W and an acceleration voltage of 80 kV. A suitable value ranging from about 20 W to 150 W was used for the high frequency power. At this time, hydrogen is also implanted into the gate electrode, and the gate electrode becomes hydrogen contained α-structure tantalum. The proportion of the hydrogen relative to the tantalum is about 2,000 atm ppm.

During PMOS TFT fabrication, implantation was carried out to about $5 \times 10^{15}$ $1/cm^2$ using a hydrogen-diluted 5% diborane ($B_2H_6$) source gas, a high frequency power of between 20 W to 150 W, and an acceleration voltage of 60 kV. When fabricating CMOS TFTs, the NMOS and PMOS are alternately covered with a mask of suitable material, such as polyamide resin; and ions are implanted into each using the method described above.

Next, interlevel insulator layer 109 was deposited to 5000 Å. In Example 1, the interlevel insulator layer was formed by PECVD using $SiO_2$. In the PECVD method, the interlevel insulator layer was formed at a substrate temperature of 300° C. using TEOS ($Si\text{-}(O\text{---}CH_2\text{---}CH_3)_4$) and oxygen ($O_2$) as source gases. An 800 W rf plasma at 13.56 MHz was generated at a pressure of 8.0 torr. The TEOS flow rate was 200 sccm, and the $O_2$ flow rate was 8000 sccm. The deposition rate for the $SiO_2$ film at this time was 12 nm/s. After ions were implanted and the interlevel insulator layer was formed, thermal annealing was performed for 1 hour at 300° C. in an oxygen atmosphere to achieve activation of implanted ions and densification of the interlevel insulator layer. The desired temperature of this thermal annealing is between 300° C. and 350° C. Contact holes are opened after thermal annealing is performed, and source and drain electrodes 110 are formed by sputtering or other means to complete the thin film semiconductor device. See FIG. 1(d). Indium tin oxide (ITO) and aluminum (Al) and the like are used for source and drain electrodes. The temperature of the substrate during sputtering of these conductors is in the approximate range of 100° C. to 250° C.

The transistor characteristics of the thin film semiconductor devices that were experimentally fabricated in this way were measured. It was found that $I_{ON}=(23.3+1.73, -1.51) \times 10^{-6}$ A at a 95% confidence level. Here, the on current, $I_{ON}$, is defined as the source-drain current Ids when transistors are turned on at source-drain voltage of Vds=4 V and gate voltage of Vgs=10 V. The off current when the transistor was turned off at Vds=4 V and Vgs=0 V was $I_{OFF}=(1.16+0.38, -0.29) \times 10^{-12}$ A. These measurements were taken at a temperature of 25° C. for transistors having channel length L=10 μm and width W=10 μm. The effective electron mobility (J. Levinson et al. J. Appl. Phys. 53, 1193' 82) found from the saturation current region was $\mu=50.92\pm3.26$ $cm^2/v.sec$. Conventional low temperature process poly-Si TFTs have $I_{ON}=(18.7+2.24, -2.09) \times 10^{-6}$ A, and $I_{OFF}=(4.85+3.88, -3.27) \times 10^{-12}$ A. As described, this invention achieves for the first time, by means of a low temperature process in which a maximum processing temperature of 425° C. or less is maintained for no more than several hours, extremely good and uniform thin film semiconductor devices that have high mobility, low variation, and Ids that changes seven orders of magnitude or more for a gate voltage change of 10 V.

EXAMPLE 2

Active matrix substrates using each of the thin film semiconductor devices obtained by the methods described in the above examples as pixel TFTs and driver circuit TFTs were manufactured. Liquid crystal panels were produced using some of these active matrix substrates. Liquid crystal display device modules were manufactured by equipping these liquid crystal panels with external peripheral drivers and a backlight unit. The performance of the TFTs themselves was high-quality, and since the manufacturing process is also reliable, it was possible to manufacture liquid crystal display devices having high display quality at low cost. In addition, the performance of TFTs was extremely high, and since the necessary driver circuits can be formed on the active matrix substrate (integrated drivers), it was possible to simplify the packaging configuration with the outside peripheral driver circuits and achieve a compact, lightweight liquid crystal display device.

These types of liquid crystal display devices were installed in the case of a full-color notebook PC, thus achieving at low cost the manufacture of a compact, lightweight full-color notebook PC having good display quality.

Possible Industrial Applications

As stated above, the method of fabricating thin film semiconductor devices described by this invention enables the manufacture of high performance thin film semiconductor devices using a low temperature process in which inexpensive glass substrates can be used. Therefore, applying this invention to the manufacture of active matrix liquid crystal display devices permits large-size, high-quality liquid crystal display devices to be manufactured easily and reliably. Moreover, when this invention is applied to the manufacture of other electronic circuits, high-quality electronic circuits can also be manufactured easily and reliably. Additionally, since the thin film semiconductor device of this invention is both low-cost and high-performance, it is optimum for active matrix substrates for active matrix liquid crystal displays. It is especially well-suited for integrated driver active matrix substrates, which require high performance.

Additionally, since the liquid crystal displays of this invention are low-cost and high-performance, they are optimum for full-color notebook PCs and all types of displays.

Additionally, since the electronic circuits of this invention are low-cost and high-performance, they will likely find wide acceptance.

After the film deposition, the thin film, which will be the gate electrode, is patterned by photolithography. The heat treatment prior to the exposure of the photoresist was carried out at about 90° C. and the heat treatment after the development was carried out at about 130° C.

At this time, hydrogen is also implanted into the gate electrode, and the gate electrode becomes hydrogen contained α-structure tantalum. The proportion of the hydrogen relative to the tantalum is about 2,000 atm ppm. 12 nm/s.

What is claimed is:

1. A thin film semiconductor device, comprising:
  a substrate;
  a semiconductor layer formed over the substrate;
  a gate insulation layer formed over the semiconductor layer; and
  a gate electrode formed over the gate insulation layer, wherein a part of the gate electrode is an α constructed tantalum that contains hydrogen in a concentration of from about 10 atm ppm to about 5,000 atm ppm.

2. The thin film semiconductor device of claim 1, wherein the semiconductor layer is formed as islands over the substrate.

3. A thin film semiconductor device, comprising:
  a substrate;
  a semiconductor layer formed over the substrate;
  a gate insulation layer formed over the semiconductor layer; and
  a gate electrode formed over the gate insulation layer, wherein the gate electrode includes tantalum that contains nitrogen and hydrogen, with the hydrogen being in a concentration of from about 10 atm ppm to about 5,000 atm ppm.

4. The thin film semiconductor device of claim 3, wherein the semiconductor layer is formed as islands over the substrate.

5. An electronic device, comprising:
  a substrate; and
  an interconnection formed over the substrate, wherein the interconnection includes an α constructed tantalum containing hydrogen in a concentration of from about 10 atm ppm to about 5,000 atm ppm.

6. An electronic device, comprising:
  a substrate;
  an interconnection formed over the substrate, wherein the interconnection includes tantalum containing nitrogen and hydrogen with the hydrogen, being in a concentration of from about 10 atm ppm to about 5,000 atm ppm.

* * * * *